US005546054A

United States Patent [19]

Maccarrone et al.

[11] Patent Number: 5,546,054

[45] Date of Patent: Aug. 13, 1996

[54] CURRENT SOURCE HAVING VOLTAGE STABILIZING ELEMENT

[75] Inventors: Marco Maccarrone, Ralestro; Marco Olivo, Bergamo; Carla M. Golla, Sesto San Giovanni, all of Italy

[73] Assignee: SGS-Thomson Microelectronics S.r.l., Agrate Brianza, Italy

[21] Appl. No.: 377,524

[22] Filed: Jan. 20, 1995

[30] Foreign Application Priority Data

Jan. 21, 1994 [EP] European Pat. Off. .............. 94830022

[51] Int. Cl.[6] .............................. H03B 5/24; G05F 3/16; H03K 3/011; H03K 3/03

[52] U.S. Cl. .......................... 331/111; 331/143; 331/173; 331/175; 331/177 R; 327/103; 327/182

[58] Field of Search ............................... 331/34, 57, 111, 331/113 R, 143–145, 153, 172, 173, 175, 176, 177 R; 327/103, 111, 182, 543

[56] References Cited

U.S. PATENT DOCUMENTS

| | | | |
|---|---|---|---|
| 4,714,901 | 12/1987 | Jain et al. | 331/111 X |
| 4,723,114 | 2/1988 | D'Arrigo et al. | 331/111 |
| 5,070,311 | 12/1991 | Nicolai | 331/111 |
| 5,233,315 | 8/1993 | Verhoeven | 331/143 X |
| 5,341,113 | 8/1994 | Baron et al. | 331/144 |
| 5,440,277 | 8/1995 | Ewen et al. | 327/543 X |

FOREIGN PATENT DOCUMENTS

| | | | |
|---|---|---|---|
| 0021289 | 1/1981 | European Pat. Off. | G05F 3/20 |
| 0575676 | 12/1993 | European Pat. Off. | 327/543 |
| 2017726 | 1/1990 | Japan | 327/103 |
| 2209254 | 5/1989 | United Kingdom | H03F 1/30 |

OTHER PUBLICATIONS

J. F. Duque–Carrillo et al., "A Family of Bias Circuits for High Input Swing CMOS Operational Amplifiers", *1992 IEEE International Symposium On Circuits and Systems*, vol. 6, pp. 3021–3024, 1992.

*Primary Examiner*—David Mis

*Attorney, Agent, or Firm*—David V. Carlson; Seed and Berry

[57] ABSTRACT

A current source including a current mirror circuit and an active load circuit which form a reference branch, for setting a reference current value, and a mirroring branch, defining an output current value, connected between supply and ground. A voltage stabilizing transistor is interposed between the current mirror circuit and the load circuit in the reference branch only, and is so biased as to maintain its gate terminal at a predetermined voltage. As such, the potential with respect to ground of the drain terminal of the reference branch load transistor is fixed, so that its drain-source voltage drop (and the current through it) is substantially independent of supply voltage. The current source may be used to advantage in an oscillator for generating the: clock signal of a nonvolatile memory.

19 Claims, 2 Drawing Sheets

CURRENT SOURCE HAVING VOLTAGE STABILIZING ELEMENT

TECHNICAL FIELD

The present invention relates to a current source, in particular for a nonvolatile memory clock oscillator.

BACKGROUND OF THE INVENTION

CMOS integrated circuits make extensive use of current sources; and, depending on required performance, particular circuit arrangements may be used the ensuring a good degree of stability with respect to specific parameters (temperature, supply voltage, technological variations, etc.). The following description takes into consideration a current source which, as far as possible, is independent of supply voltage, even when the supply voltage varies between 2.7 and 7–8 V. Of the various arrangements currently proposed, the most suitable for this purpose is shown in FIG. 1.

In detail, the current source in FIG. 1 comprises a current mirror circuit 1 formed by two P-channel transistors 2, 3 with a given width/length ratio W/L. Transistor 2 is diode-connected and presents the source terminal connected to the source terminal of transistor 3. The two source terminals are connected to supply $V_{DD}$ via a P-channel transistor 4 with a control terminal defining an input node 5 supplied with an inverted enabling signal CEN. The drain terminal of transistor 2 (defining node 6) is connected to the drain terminal of an N-channel transistor 7, the source terminal of which is grounded via a resistor 8, and the gate terminal of which is connected to the gate terminal of a further N-channel transistor 9, the source terminal of which is grounded, and the drain terminal of which is short-circuited to the gate terminal and connected to the drain terminal of transistor 3. A filtering capacitor 10 is connected between node 6 and ground, and likewise a native (low-threshold) N-channel boost transistor 11, the gate terminal of which defines an input node 12 supplied with the CEN signal. A P-channel transistor 15, similar to transistor 3, presents the gate terminal connected to node 6, the source terminal connected to supply $V_{DD}$, and the drain terminal of which defines an output 16 supplied with a predetermined current I. Though no shown, node 6 may be connected to the gate terminals of additional transistors, similar to 15, if a number of current sources are required for the same device.

The relative dimensions of transistors 2 and 3 determine the ratio of the currents supplied respectively to transistors 7 and 9. For example, if $(W/L)_3$ is the dimensional parameter (width/length ratio) of transistor 3, and $(W/L)_2$ the dimensional parameter of transistor 2, and if $(W/L)=2(W/L)_2$: $I_3=2I_2$, where $I_3$ is the current through transistor 3 (which determines the output current I of the source), and $I_2$ the current through transistor 2.

If transistors 7 and 9 present the same dimensions, the ratio of the currents flowing through them only remains the same as that set by transistors 2 and 3 if the respective gate-source voltage drops Vgs differ. In the above case, it is necessary that Vgs7<Vgs9, where Vgs7 is the voltage drop between the gate and source terminals of transistor 7, and Vgs9 that of transistor 9.

The current $I_r$ through resistor 8, with a resistance R8 and a voltage drop $V_8$, is therefore given by the following equation:

$$I_r=V_8/R8=(Vgs9-Vgs7)/R8$$

As, roughly speaking, the gate-source voltage drops of transistors 7 and 9 depend solely on thee threshold voltage $V_T$ of the transistors and the current flowing through them, hence on $I_r$, the latter is independent of supply voltage $V_{DD}$.

In actual fact, however, a secondary effect exists, due to the output resistance of transistors 7, 9, which is not infinite and which results in a dependence of current $I_r$ on the drain-source voltage drop Vds of the transistors. In fact, due to transistors 2 and 9 being diode-connected, Vds2=Vgs2 and Vds9=Vgs9, which means Vds2 and Vds9 vary little alongside a variation in supply voltage. On the other hand:

$$Vds7+Vds2+V_*=V_{DD}$$

so that any variation in supply voltage must be absorbed by the drain-source voltage drop of transistor 7.

Since:

$$R_R=K½*(W/L)_7*(Vgs7-V_T)^2+Vd7/Ro7 \quad (1)$$

where K1 is a constant depending on fabrication technology, $(W/L)_7$ is the dimensional parameter of transistor 7, and Ro7 is the output resistance of transistor 7 (see, for example, formula 9.2.11, page 441, of "Device Electronics for Integrated Circuits," second edition, by Richard S. Muller and Theodore I. Kamins, defining $K*\lambda*(V_G-V_T)^2/2=1/Ro7$), and since Ro7 is not of infinite value, the current through resistor 8 (and which is mirrored in the desired ratio into transistors 3 and 15) thus depends on the drain-source voltage drop of transistor 7 and hence on supply voltage $V_{DD}$.

To solve this problem, several variations have been proposed using a number of transistors connected in series with transistors 7 and 9 to increase the equivalent output resistance of the transistors and so reduce the dependence of reference current $I_r$ on the drain-source voltage drop. Such solutions, however, fail to operate at low supply voltage $V_{DD}$ values, in that, to be turned on, a pile of n transistors in series requires a supply voltage of over $n*V_T$, where $VV_T$~0.6 V.

It is an object of the present invention to provide a current source which is substantially independent of supply voltage.

SUMMARY OF THE INVENTION

In a preferred embodiment of the present invention, a stabilizing transistor is c, connected in series with the reference branch transistor only, and is so biased as to fix its gate voltage at a predetermined value. As such, the potential with respect to ground of the drain terminal of the reference branch load transistor is also fixed, so that its drain-source voltage drop is approximately independent of supply voltage.

DETAILED DESCRIPTION OF THE INVENTION

Figure 1:
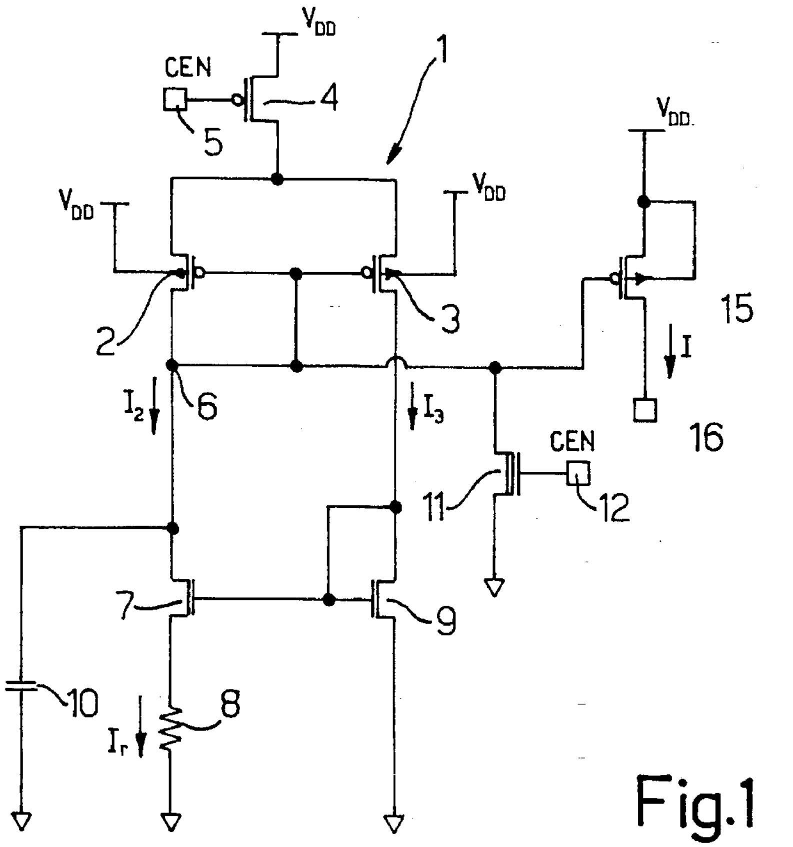
FIG. 1 shows a known type of current source.
Figure 2:
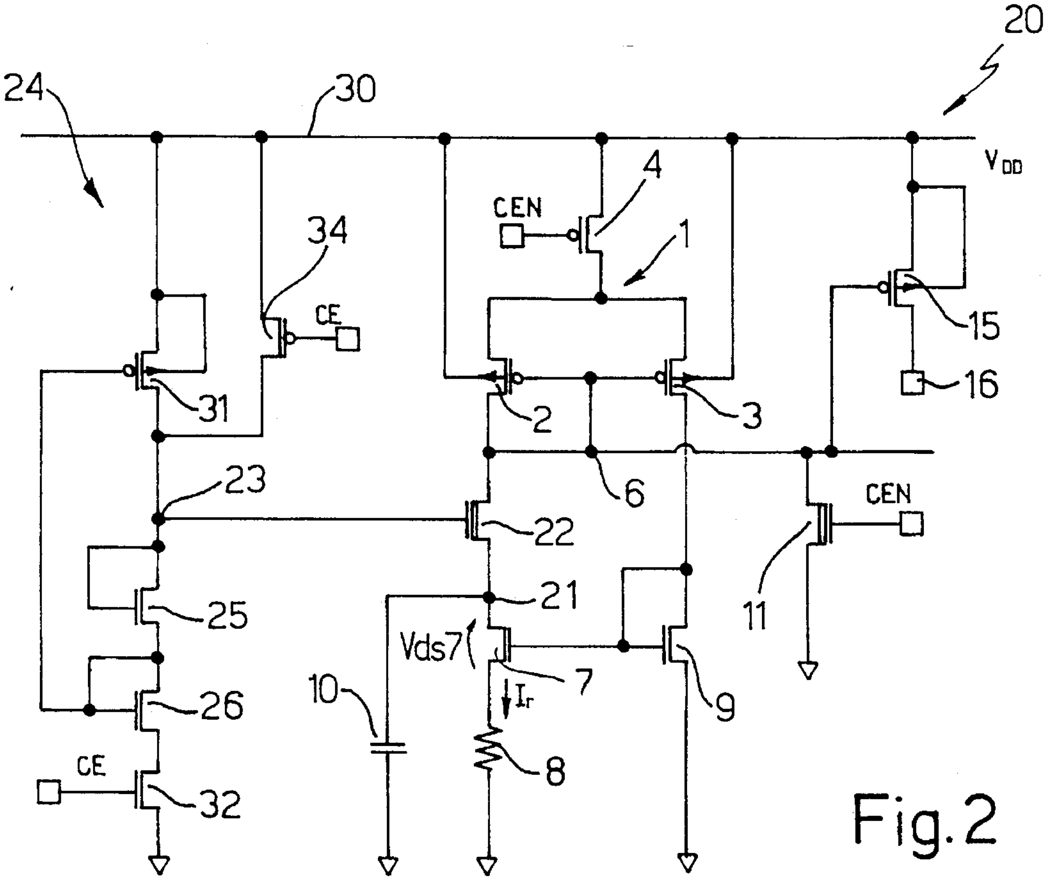
FIG. 2 shows one embodiment of the source according to the present invention.

In FIG. 2, the current source is indicated as a whole by 20, and presents a basic arrangement similar to that in FIG. 1 with the exception of the elements described below. As such, any elements in common with the known arrangement in FIG. 1 are indicated using the same numbering system, and not described in detail.

In the source according to the present invention, between node 6, formed by the gate and drain terminals of transistor 2, and the drain terminal of transistor 7 (node 21), there is provided an N-channel native transistor 22, the gate terminal of which defines node 23 of a voltage source 24 comprising a pair of diode-connected N-channel transistors 25, 26 connected in series with each other and connected between supply line 30 and ground via respective transistors 31,32.

More specifically, P-channel transistor 31 presents the source terminal connected to supply line 30; the drain terminal connected to node 23 and the drain terminal of diode-connected transistor 25; and the gate terminal connected to the gate terminal of diode-connected transistor 26. N-channel transistor 32, which operates as a switch, presents the drain terminal connected to the source terminal of transistor 26; a grounded source terminal; and is supplied at the gate terminal with an enabling signal CE opposite to signal CEN.

Node 23 is connected to supply line 30 by a P-channel transistor 34 which presents the source terminal connected to line 30; the drain terminal connected to node 23; and is supplied at the gate terminal with enabling signal CE.

In the ON condition, signal CE is high and signal CEN low, so that transistors 32 and 4 are turned on, voltage source 24 is grounded, mirror circuit 1 is biased, and transistors 34 and 11 for biasing in the off condition (as described below) are turned off.

When the current source is in the ON condition, the gate terminal 31 is at voltage $V_T$, equal to the gate-source voltage drop of transistor 26, so that transistor 31 is turned on; node 23 is maintained at a voltage of $2V_T$ (voltage drop of diode-connected transistors 25, 26) and node 21 at a fixed voltage of $V_T$; the drain-source voltage drop of transistor 7, minus the very low voltage drop of resistor 8, roughly equals $V_T$; so that the drain-source voltage drop Vds7 of transistor 7 is very close to the drain-source voltage drop Vds9 of diode-connected transistor 9, thus ensuring a good degree of symmetry of the two branches; of the current source.

Figure 3:
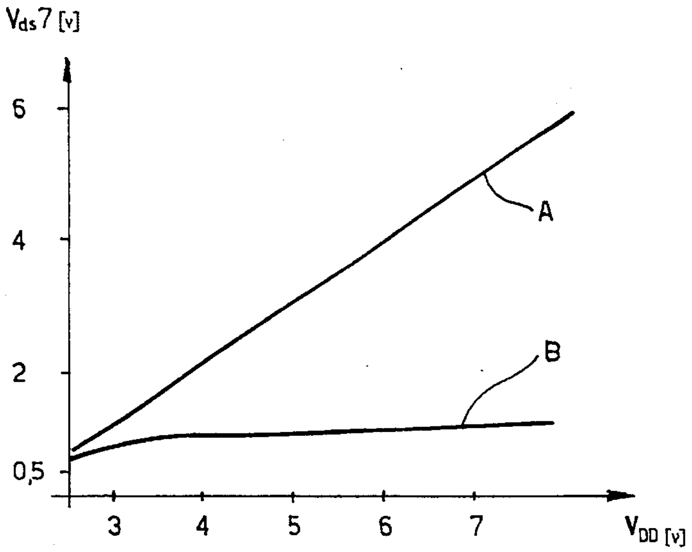
FIG. 3 shows a comparative diagram of the known arrangement and that in FIG. 2.

The result obtained using the FIG. 2 circuit is shown in the comparative diagram in FIG. 3, which shows two curves A and B indicating Vds7 versus supply voltage $V_{DD}$ tbr the known circuit in FIG. 1 and the FIG. 2 circuit respectively.

In source 20, transistor 4 provides in known manner for opening the current path between supply line 30 and ground in the off condition (high CEN signal); and transistor 11 provides for biasing source 20 in the off condition to ensure that, when turned on again,-the circuit is brought to the correct operating point. In fact, in the OFF condition (high CEN signal), transistor 11 is turned on, so that node 6 and hence the gate terminals of transistors 2, 3 are grounded. As soon as the circuit is turned on again, transistor 11 is turned off, but the low voltage at node 6 immediately turns on transistors 2, 3 as soon as transistor 4 is turned on again.

Transistor 34 of voltage source 24 performs the same function as transistor 11, mid is therefore turned on when the circuit is off, and keeps node 23 connected to the supply voltage, so that, when the circuit is turned on again, node 23 is at a high potential and may safely reach its stable state at $2V_T$, without the other stable balance condition being established, when voltage source 24 is off.

In operating mode, the gate terminal of transistor 31 is preferably biased to voltage $V_T$, as already explained, for reducing the current through voltage source 24 and hence consumption by it in operating mode. In fact, a rewrite of equation (1) with reference to transistor 31, and not taking into account the second order term due to output resistance, gives:

$$I=K1*(W/L)_{31}*(Vgs31-V_T)^2$$

where $(W/L)_{31}$ is the dimensional parameter of transistor 31; Vgs31 it gate-source voltage drop; and $V_T$ its threshold voltage. In the solution shown, $Vgs31=V_{DD}-V_T$, that is, is less than the $V_{DD}$ value which would be obtained if transistor 31 were to be controlled directly by the inverted enabling signal CEN. Current I may thus be set to a low level without changing the dimensions of transistor 3, 1 (e.g., increasing L).

When voltage source 24 is off, transistor 34 is turned on and maintains node 23 at $V_{DD}$ (as already stated); transistor 32 is turned off, thus opening the current path between line 30 and ground; and the gate terminal of diode-connected transistor 26, like the gate terminal of transistor 31, is at $V_{DD}$−VT, where $V_T$ is the gate-source voltage drop of transistor 25. Though less than the full supply voltage, this value is nevertheless sufficient to keep transistor 31 off.

When switching from off to on and vice versa, the gate terminal of transistor 3,1 must therefore cover an excursion of $V_{DD}2V_T$, i.e., less than that which would be required if transistor 31 were to be biased to ground when on and to the supply voltage when off, thus accelerating the on-off transistors.

The current source according to the present invention is therefore less sensitive, as compared with known solutions, to variations in supply voltage, regardless of size which may be particularly small without impairing the stability of the circuit. Moreover, this is achieved with only a very small increase in the complexity of the circuit, by merely inserting a transistor and the voltage source, and with only a small increase in size and no effect on reliability.

The FIG. 2 current source may be employed to advantage in square wave oscillators generating the clock signal of synchronous digital devices (e.g., nonvolatile flash memories).

Figure 4:
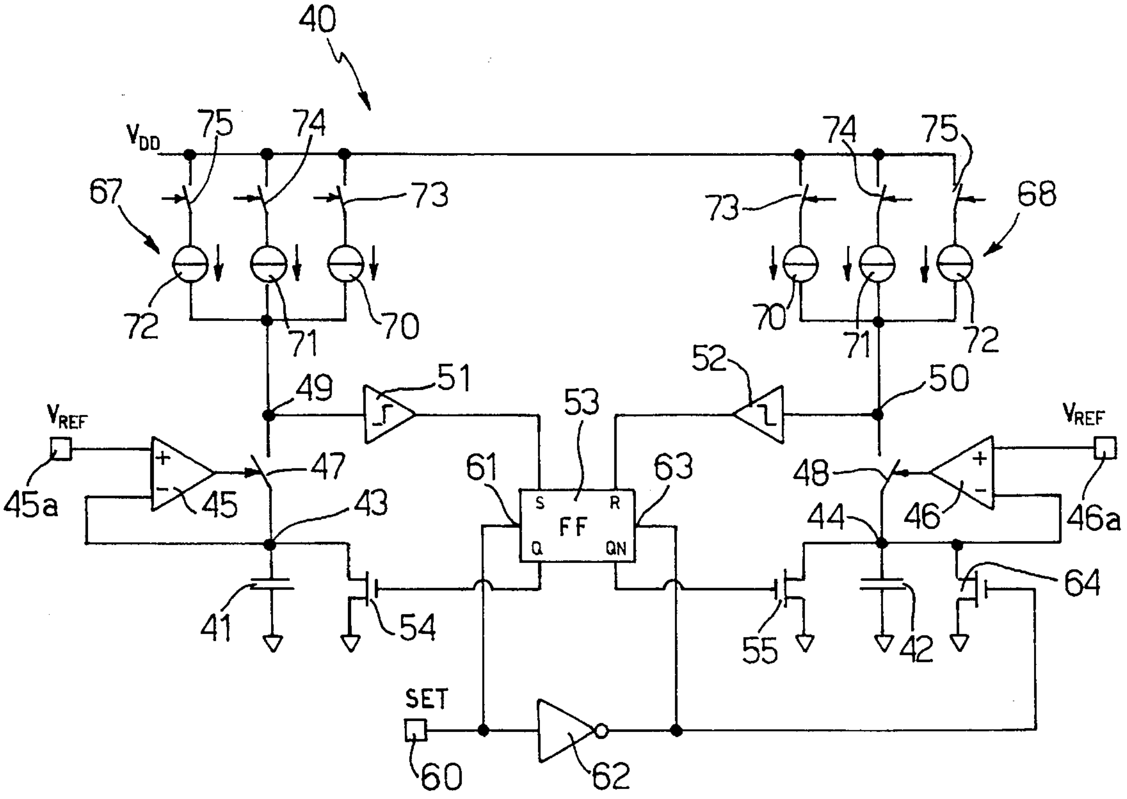
FIG. 4 shows one possible application of the current source according to the present invention.

Such an application is shown by way of example in FIG. 4 in which the oscillator is indicated as a whole by 40.

Oscillator 40 is an analog type with two capacitors 41, 42 which are charged with constant current to a predetermined level. In detail, each capacitor 41, 42 is connected between a respective node 43, 44 and ground. In turn, each respective node 43, 44 is connected to the inverting input of a respective comparator 45, 46, the noninverting input that is connected to a respective: input node 45*a*, 46*a* which is supplied with a reference voltage $VRE_F$. The output of comparator 45, 46 controls a switch 47, 48 interposed between a node 49, 50 and node 43, 44. Node 49, 50 is connected to the input of a respective Schmitt trigger device 51, 52, the output of which is connected to a respective input S, R of a flip-flop 53. The outputs of the flip-flop Q, QN are connected to the gate terminal of a respective N-channel discharging transistor 54, 55 that is positioned between node 43, 44 and ground. Oscillator 40 also comprises a disabling input 60 supplied with a SET signal, and which is connected directly to a first input 61 of flip-flop 53, and indirectly, i.e., via an inverter 62, to a second input 63 of flip-flop 53. The output of the inverter is connected to the gate terminal of an N-channel MOS transistor 64 interposed between node 44 and ground.

Oscillator 40 also comprises two generating units 67, 68. Each of these units comprises three current sources 70–72 designed as taught by the present invention, connected parallel with one another between node 49, 50 and supply line $V_{DD}$. In series with each current source 70–72, a controlled switch 73–75 is provided for selectively coupling respective source 70–72 to node 49, 50.

Oscillator 40 operates as follows. When the SET signal switches from low .(corresponding to the off state of oscillator 40) to high, flip-flop 53 switches output Q to low, thus turning off transistor 54 and enabling capacitor 41 to be charged to the current set by generating unit 67. When voltage at node 43 reaches the predetermined value, the output of comparator 45 switches to open switch 47; and the voltage at node 49 increases rapidly, almost instantly, to supply voltage $V_{DD}$, thus switching trigger 51 and flip-flop 53, which turns off transistor 55 (to commence charging capacitor 42), and turns on transistor 54 to commence discharging capacitor 41. Similarly, once capacitor 55 is charged, flip-flop 53 again switches to commence charging capacitor 41 once more.

The FIG. 4 oscillator presents the advantage of being able to modulate the charge current of capacitors 41, 42. By appropriately designing sources 70–72 (having a dimensional parameter (W/L) whose ratio with respect to transistor 2 provides for obtaining a current equal to reference current $I_r$, or a multiple of it) and by so controlling switches 73–75 as to selectively connect sources 70–72 to node 49, 50, the total charge current, and hence the charging speed, of capacitors 41, 42 may be regulated as required, and the oscillating frequency of oscillator 40 modified for ensuring particularly fine adjustment.

Trigger devices 51, 52 provide for avoiding false switching of the circuit. In fact, especially in the case of low frequency, when the voltage ramp of the capacitors is slow, and in the presence of noise, the output of comparators 45, 46 may repeatedly switch, thus resulting in undesired oscillation of the circuit. Such oscillation, however, is prevented by triggers 51, 52 which, after switching, store the output status, even in the presence of minor oscillations at the input.

The reference voltage $V_{REF}$ of oscillator 40 in FIG. 4 may be generated by a voltage source similar to 24 in FIG. 2, to achieve the same advantages in terms of stability alongside variations in temperature and supply voltage.

A further advantage is the connection of the inputs of Schmitt trigger devices 51, 52 to nodes 49, 50, so that switching of the triggers (and hence oscillation frequency) is independent of the switch threshold value which, as is known, depends on various parameters, such as supply voltage and technological variations, and any variation in which would impair the stability of the circuit.

The above-provided description will enable those skilled in the art to make changes to the preferred embodiments described herein without departing from the scope of the present invention. Accordingly, the present invention encompasses all such changes which read upon the appended claims and equivalents thereof.

We claim:

1. A current source comprising a current mirror circuit and an active load circuit which define a reference branch for setting a reference current value, and a mirroring branch for defining an output current value; said reference branch and said mirroring branch being connected between a first and second reference potential line; characterized by the fact that said reference branch presents a voltage stabilizing element located along said reference branch and presenting a first terminal connected to said current mirror circuit, and a second terminal connected to said active load circuit; said voltage stabilizing element maintaining the potential of said second terminal with respect to said second reference potential line.

2. A circuit as claimed in claim 1, characterized by the fact that said voltage stabilizing element comprises a transistor element interposed between said currently mirror circuit and said load circuit on said reference branch, and having a control terminal connected to the output of a constant voltage source.

3. A circuit as claimed in claim 2, characterized by the fact that said transistor element is a native MOS transistor.

4. A circuit as claimed in claim 2, characterized by the fact that said voltage source comprises a number of diode elements connected in series between said first and said second reference potential line.

5. A circuit as claimed in claim 4, characterized by the fact that said voltage source comprises a switchable load element and a first controlled switch clement; said load element being interposed between said diode elements and said first reference potential line; said first switch element being interposed between said diode elements and said second reference potential line; and said load element and first switch element presenting control terminals supplied with enabling signals.

6. A circuit as claimed in claim 5, characterized by the fact that said load element comprises a P-channel MOS transistor with the gate terminal connected to an intermediate point of said number of diode elements.

7. A circuit as claimed in claim 5, characterized by the fact that it comprises a second switch element connected between said first reference potential line and said output node of said voltage source; said second switch element being activated when said voltage source is disabled.

8. An analog oscillating device comprising a capacitive element; a charge current generating element coupled to a first reference potential line; reference value generating means; comparing means connected to said capacitive element and said reference value generating means; a controllable switch connected in series between said capacitive element and said charge current generating element said controllable switch being controlled by said comparing means; a storage element; a storage threshold element connected in series between said charge current generating element and said storage element; and a discharging element connected to said capacitive element and driven by said storage element; characterized by the fact that said charge current generating element comprises at least one current source.

9. An oscillating device as claimed in claim 8, characterized by the fact that said charge current generating element comprises a number of said current sources connected in parallel with one another and selectively enabled for modulating the charge current of said capacitive element.

10. An oscillating device as claimed in claim 8, characterized by the fact that said storage threshold element comprises a Schmitt trigger.

11. A current source comprising:

a first enabling switch having a control terminal coupled to a first enabling signal, a first path terminal coupled to a supply voltage line, and a second path terminal;

a first mirror switch having a first path terminal coupled to the second path terminal of the first enabling switch, a control terminal, and a second path terminal that is coupled to the control terminal;

a second mirror switch having a first path terminal coupled to the second path terminal of the first enabling switch, a control terminal coupled to the control terminal of the first mirror switch, and a second path terminal;

a voltage stabilizing switch having a first path terminal coupled to the second path terminal of the first mirror switch, a control terminal and a second path terminal;

- a first load element coupled between the second path terminal of the voltage stabilizing switch and a reference voltage line;
- a voltage source circuit coupled between the supply voltage line and the reference voltage line, the voltage source circuit having an output coupled to the control terminal of the voltage stabilizing switch;
- a second load element coupled between the second path terminal of the second mirror switch and the reference voltage line; and
- an output switch element having a first path terminal coupled to the supply voltage line, a control terminal coupled to the second path terminal of said first .mirror switch, and a second path terminal, the second path terminal being an output terminal for providing an output current.

12. The current source of claim 11 wherein the voltage source circuit comprises:

- a first connecting switch having a first path terminal coupled to the supply voltage line, a control terminal coupled to a second enabling signal, and a second path terminal coupled to the control terminal of the voltage stabilizing switch.

13. The current source of claim 12 wherein the voltage source circuit further comprises:

- a second connecting switch having a first path terminal coupled to the supply voltage line, a second path terminal coupled to the control terminal of the voltage stabilizing switch, and a control terminal; and
- a voltage clamping circuit coupled to the control terminal of the second connecting switch, and the reference voltage line.

14. The current source of claim 13 wherein the voltage clamping circuit comprises:

- a first diode element having a first pathway coupled to the second path terminal of the second connecting switch, and having a second pathway coupled to the reference voltage line.

15. The current source of claim 14 wherein the second pathway of the first diode element is coupled to the reference voltage line via a third connecting switch, the third connecting switch having a control terminal coupled to the second enabling signal, a first path terminal coupled to the second pathway of the first diode element, and a second path terminal coupled to the reference voltage line.

16. The current source of claim 14 wherein the first pathway of the first diode element is coupled to the second path terminal of the second connecting switch via a second diode element, the-second diode element having a first pathway coupled to the second path terminal of the second connecting switch and having a second pathway coupled to the first pathway of the first diode element.

17. The current source of claim 11 wherein the voltage source circuit further comprises:

- a first connecting switch having a first path terminal coupled to the supply voltage line, a second path terminal coupled to the control terminal of the voltage stabilizing switch, and a control terminal; and
- a first diode element having a first pathway coupled to the second path terminal of the first connecting switch, and having a second pathway coupled to the reference voltage line.

18. The current source of claim 17 wherein the second pathway of the first diode element is coupled to the reference voltage line via a third connecting switch, the third connecting switch having a control terminal coupled to the second enabling signal, a first path terminal coupled to the second pathway of the first diode element, and a second path terminal coupled to the reference voltage line.

19. The current source of claim 18 wherein the first pathway of the first diode element is coupled to the second path terminal of the first connecting switch via a second diode element, the second diode element having a first pathway coupled to the second path terminal of the second connecting switch and having a second pathway coupled to the first pathway of the first diode element.

* * * * *

UNITED STATES PATENT AND TRADEMARK OFFICE

CERTIFICATE OF CORRECTION

PATENT NO. : 5,546,054
DATED : August 13, 1996
INVENTOR(S) : Marco Maccarrone et al.

It is certified that error appears in the above identified patent and that said Letters Patent is hereby corrected as shown below:

In column 6, claim 8, line 35, immediately following "generating element", please insert --,--.

In column 8, claim 16, line 11, please delete "the-second" and insert therefor --the second--.

Signed and Sealed this

Nineteenth Day of November, 1996

Attest:

Bruce Lehman

BRUCE LEHMAN

*Attesting Officer* *Commissioner of Patents and Trademarks*